(12) United States Patent
Zhang et al.

(10) Patent No.: US 12,376,421 B2
(45) Date of Patent: Jul. 29, 2025

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Bike Zhang, Zhejiang (CN); Jingsheng Jin, Zhejiang (CN); Xinyu Zhang, Zhejiang (CN); Jingyu Cao, Zhejiang (CN); Haiyan Cheng, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 65 days.

(21) Appl. No.: 18/163,871

(22) Filed: Feb. 2, 2023

(65) Prior Publication Data
US 2023/0420580 A1    Dec. 28, 2023

(30) Foreign Application Priority Data
Jun. 27, 2022    (CN) .......................... 202210745275.2

(51) Int. Cl.
*H10F 77/00* (2025.01)
*H10F 10/14* (2025.01)
(Continued)

(52) U.S. Cl.
CPC ........... *H10F 77/937* (2025.01); *H10F 10/14* (2025.01); *H10F 19/80* (2025.01); *H10F 19/902* (2025.01);
(Continued)

(58) Field of Classification Search
None
See application file for complete search history.

(56) References Cited

U.S. PATENT DOCUMENTS 6,114,046 A * 9/2000 Hanoka ................. H01L 31/048
                                                                156/99
11,450,777 B1   9/2022 Qiu et al.
(Continued)

FOREIGN PATENT DOCUMENTS

CN         108666393 A        10/2018
CN         110690297 A         1/2020
(Continued)

OTHER PUBLICATIONS

Machine translation—KR20160097926A (Year: 2016).*
(Continued)

*Primary Examiner* — Tamir Ayad
(74) *Attorney, Agent, or Firm* — USCH Law, PC

(57) ABSTRACT

Embodiments of the present disclosure provide a solar cell and a photovoltaic module. The solar cell includes a substrate, a tunneling dielectric layer formed on the substrate, a doped conductive layer formed on the tunneling dielectric layer, at least one conductive connection structure, a passivation layer over the doped conductive layer and the at least one conductive connection structure, and a plurality of finger electrodes. The doped conductive layer has a plurality of protrusions arranged along a first direction, each protrusion extends along a second direction perpendicular to the first direction. The at least one conductive connection structure is formed between two adjacent protrusions and connected with sidewalls of the two adjacent protrusions. Each finger electrode of the plurality of finger electrodes extends along the second direction to penetrate the passivation layer and connect to a respective protrusion.

16 Claims, 4 Drawing Sheets

(51) Int. Cl.
*H10F 19/80* (2025.01)
*H10F 19/90* (2025.01)
*H10F 77/122* (2025.01)
*H10F 77/164* (2025.01)
*H10F 77/166* (2025.01)
*H10F 77/20* (2025.01)

(52) U.S. Cl.
CPC ....... *H10F 77/122* (2025.01); *H10F 77/1645* (2025.01); *H10F 77/1662* (2025.01); *H10F 77/215* (2025.01)

(56) References Cited

U.S. PATENT DOCUMENTS

| | | | |
|---|---|---|---|
| 2009/0146239 A1* | 6/2009 | Miyachi | H01L 31/085 438/57 |
| 2012/0174975 A1* | 7/2012 | Shin | H01L 31/022433 136/256 |
| 2012/0235268 A1 | 9/2012 | Niira et al. | |
| 2013/0087194 A1* | 4/2013 | Jang | H01L 31/18 136/258 |
| 2020/0287066 A1 | 9/2020 | Stodolny et al. | |
| 2022/0158009 A1* | 5/2022 | Jin | H01L 31/0745 |

FOREIGN PATENT DOCUMENTS

| | | | | |
|---|---|---|---|---|
| CN | 210272384 U | 4/2020 | | |
| CN | 210897294 U | 6/2020 | | |
| CN | 112259621 A | 1/2021 | | |
| CN | 112349798 A | 2/2021 | | |
| CN | 112466961 A | 3/2021 | | |
| CN | 112466962 A | 3/2021 | | |
| CN | 112635592 A | 4/2021 | | |
| CN | 113299770 A | 8/2021 | | |
| CN | 113471321 A | 10/2021 | | |
| CN | 113571604 A | 10/2021 | | |
| CN | 214336723 U | 10/2021 | | |
| CN | 214477490 U | 10/2021 | | |
| CN | 115101619 A | 9/2022 | | |
| EP | 4002493 A1 | 5/2022 | | |
| EP | 4195301 A1 | 6/2023 | | |
| GB | 2509097 A | * | 6/2014 | ..... H01L 31/022433 |
| JP | H11274538 A | 10/1999 | | |
| JP | 2010262979 A | 11/2010 | | |
| JP | 2016103642 A | 6/2016 | | |
| JP | 2016119346 A | 6/2016 | | |
| JP | 2019117963 A | 7/2019 | | |
| JP | 2019179838 A | 10/2019 | | |
| JP | 2022081367 A | 5/2022 | | |
| JP | 7284865 B1 | 5/2023 | | |
| KR | 1020120096178 A | 8/2012 | | |
| KR | 20160097926 A | 8/2016 | | |
| KR | 101740523 B1 | 5/2017 | | |
| WO | 2011065571 A1 | 6/2011 | | |

OTHER PUBLICATIONS

Zhejiang Jinko Solar Co. Ltd., et al., Extended European Search Report, EP 23154994.0, Nov. 27, 2023, 10 pgs.

Zhejiang Jinko Solar Co. Ltd., et al., Extended European Search Report, EP 22212300.2, Sep. 22, 2023, 4 pgs.

Zhejiang Jinko Solar Co. Ltd., et al., Examination report No. 1 for your standard patent application, AU 2022283790, Oct. 20, 2023, 6 pgs.

Zhejiang Jinko Solar Co., Ltd et al., JP Decision to Grant a Patent with English translation, JP 2022-212228, 2023-04-20, 5 pgs.

Zhejiang Jinko Solar Co., Ltd., et al., Notice of Reasons for Refusal with English translation, JP 2023-018906, Dec. 26, 2023, 12 pgs.

Zhejiang Jinko Solar Co., Ltd., et al., Communication pursuant to Article 94(3) EPC, EP 23154994.0, Apr. 25, 2024, 6 pgs.

Zhejiang Jinko Solar Co., Ltd., et al., Non Final Rejection, U.S. Appl. No. 18/061,401, Mar. 27, 2024, 34 pgs.

Zhejiang Jinko Solar Co., Ltd., et al., JP First Office Action with English translation, JP 2023-082696, Jun. 26, 2024, 8 pgs.

Zhejiang Jinko Solar Co., Ltd., et al., KR Notice of Allowance with English translation, KR 10-2023-0093424, Aug. 30, 2024, 9 pgs.

\* cited by examiner

SOLAR CELL AND PHOTOVOLTAIC MODULE

CROSS REFERENCE TO RELATED APPLICATIONS

The present application claims the benefit of priority under the Paris Convention to Chinese Patent Application No. 202210745275.2 filed on Jun. 27, 2022, which is incorporated herein by reference in its entirety.

TECHNICAL FIELD

Embodiments of the present disclosure relate to the photovoltaic field, and in particular to a solar cell and a photovoltaic module.

BACKGROUND

With the increasing shortage of energy, the development and utilization of renewable energy is extremely urgent. Among the numerous renewable energy sources, solar energy has outstanding advantages such as no depletion risk, safety and reliability, no noise, no pollution emissions, and no limitation on distribution region of resources to its application.

Solar cells are used to convert solar energy into electrical energy, thus solar cells have been widely used. Solar cells may be classified into crystalline silicon cells and thin film cells. Among crystalline silicon cells, cells with a passivation contact structure of at least one tunneling oxide layer are widely favored because of their higher theoretical efficiency. Therefore, it is necessary to study cells with a passivation contact structure of at least one tunneling oxide layer which have better performance.

SUMMARY

Embodiments of the present disclosure provide a solar cell and a photovoltaic module, which are at least conducive to improving performance of cells with a passivation contact structure of at least one tunneling oxide layer.

Some embodiments of the present disclosure provide a solar cell including a substrate, a tunneling dielectric layer, a doped conductive layer, at least one conductive connection structure, a passivation layer and a plurality of finger electrodes. The tunneling dielectric layer is formed on the substrate. The doped conductive layer is formed on the tunneling dielectric layer and has a plurality of protrusions arranged along a first direction, each protrusion of the plurality of protrusions extends along a second direction perpendicular to the first direction. The at least one conductive connection structure is formed between two adjacent protrusions and is connected with sidewalls of the two adjacent protrusions. The passivation layer is over the doped conductive layer and the at least one conductive connection structure. Each finger electrode of the plurality of finger electrodes extends along the second direction to penetrate the passivation layer and connect to a respective protrusion.

In some embodiments, the solar cell includes a plurality of conductive connection structures arranged at intervals along at least one of the first direction and the second direction, and there is at least one finger electrode between adjacent conductive connection structures in the first direction.

In some embodiments, there is at least one conductive connection structure between each two adjacent finger electrodes.

In some embodiments, there are a plurality of conductive connection structures arranged at intervals between adjacent finger electrodes.

In some embodiments, in the second direction, a distance between adjacent conductive connection structures of the plurality of conductive connection structures arranged at intervals is constant.

In some embodiments, a distance between adjacent conductive connection structures in the second direction ranges from 0.01 mm to 20 mm.

In some embodiments, the plurality of conductive connection structures form an array, and the array comprises a plurality of columns of conductive connection structures arranged along the first direction and a plurality of rows of conductive connection structures arranged along the second direction.

In some embodiments, the solar cell further includes at least one busbar extending along the first direction and electrically connected with the plurality of finger electrodes arranged along the first direction.

In some embodiments, the plurality of conductive connection structures are spaced from the at least one busbar.

In some embodiments, projections of the plurality of conductive connection structures on the substrate are at least partially overlapped with a projection of the at least one busbar on the substrate.

In some embodiments, the solar cell includes a plurality of busbars, and there are at least two columns of conductive connection structures arranged along the first direction on a side of a peripheral busbar towards an edge of the substrate.

In some embodiments, a width of the at least one conductive connection structure in the second direction ranges from 10 μm to 500 μm.

In some embodiments, in a direction perpendicular to the substrate, a top surface of the at least one conductive connection structure is lower than or flush with a top surface of a protrusion.

In some embodiments, the at least one conductive connection structure and the doped conductive layer are made of a same material.

In some embodiments, a material of the doped conductive layer includes one of doped amorphous silicon, doped polycrystalline silicon and doped microcrystalline silicon.

In some embodiments, the doped conductive layer and the substrate are of a same doping type.

In some embodiments, the substrate is an N-type substrate, and the doped conductive layer is an N-type polycrystalline silicon layer.

Some embodiments of the present disclosure provide a photovoltaic module, including: at least one cell string including a plurality of solar cells as described above, the plurality of solar cells are electrically connected in sequence; at least one encapsulation layer configured to cover a surface of the at least one cell string; and at least one cover plate configured to cover a surface of the at least one encapsulation layer facing away from the at least one cell string.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations. In order to more clearly illustrate the embodiments of the present disclosure or the technical solutions in the existing technology, the following will briefly describe the drawings used in the embodiments. Obviously, the drawings in the following description are only some embodiments of the present disclosure. Those skilled in the art can also obtain other drawings based on these drawings without any inventive work.

DETAILED DESCRIPTION OF THE EMBODIMENTS

It can be known from the background art that parasitic absorption of light of the existing doped conductive layer may reduce utilization rate of light of solar cells. Generally, a thickness of the doped conductive layer is reduced to address the parasitic absorption of light of the doped conductive layer. To this end, a structure of the doped conductive layer having protrusions is proposed. A relatively thick doped conductive layer is formed in a region in which the finger electrodes are formed, and a relatively thin doped conductive layer is formed in a region between adjacent finger electrodes. In this way, the parasitic absorption of light of the doped conductive layer can be reduced. However, this structure introduces new problems. For example, due to the narrow transverse transferring channel resulted from the relatively thin doped conductive layer formed in the region between adjacent finger electrodes, a large number of carriers collide and consume each other in the transferring process, thereby affecting the transferring rate of carriers In the embodiments of the present disclosure, at least one conductive connection structure is formed between and connected with adjacent protrusions. In this way, the carriers can be transferred through the at least one conductive connection structure in the transverse transferring process, thereby improving the transverse transferring capacity of the carriers and the doped conductive layer. Moreover, compared with the relatively thick doped conductive layer, the solar cell provided by the present disclosure can reduce parasitic absorption of light of the doped conductive layer.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be realized.

Figure 1:
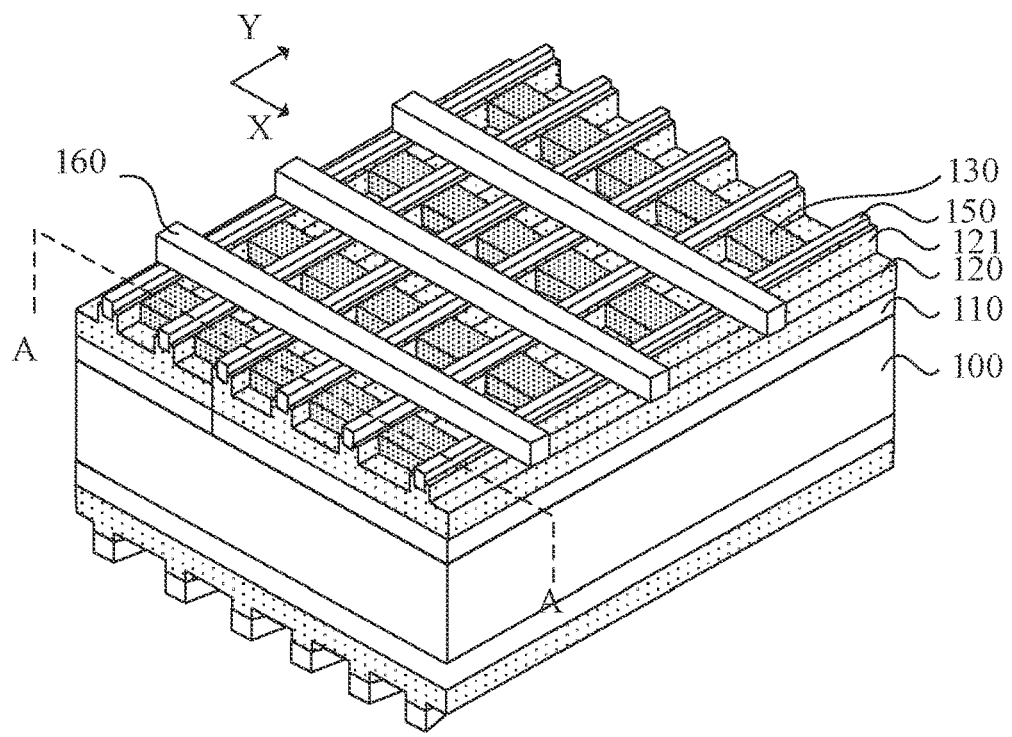
FIG. 1 is a structural schematic diagram of a solar cell according to some embodiments of the present disclosure.
Figure 2:
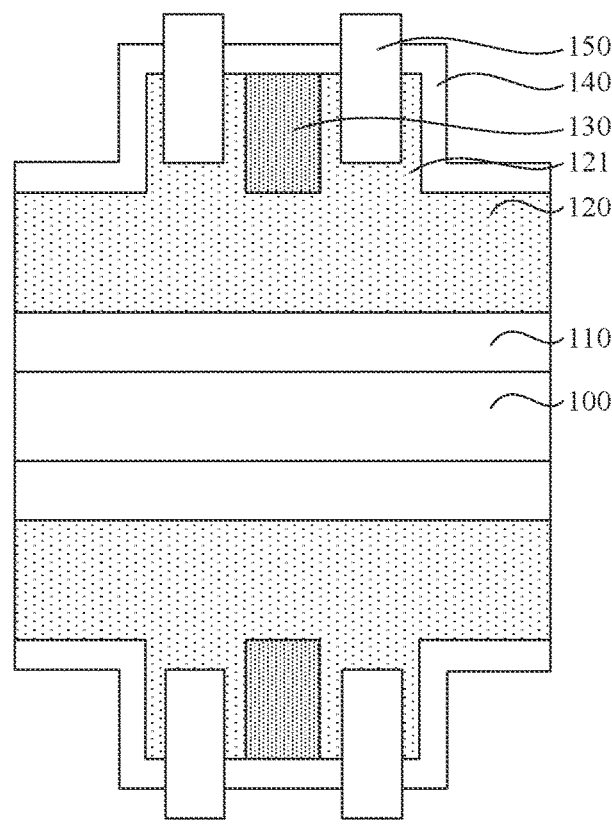
FIG. 2 is a sectional schematic diagram of the solar cell according to some embodiments of the present disclosure.
Figure 3:
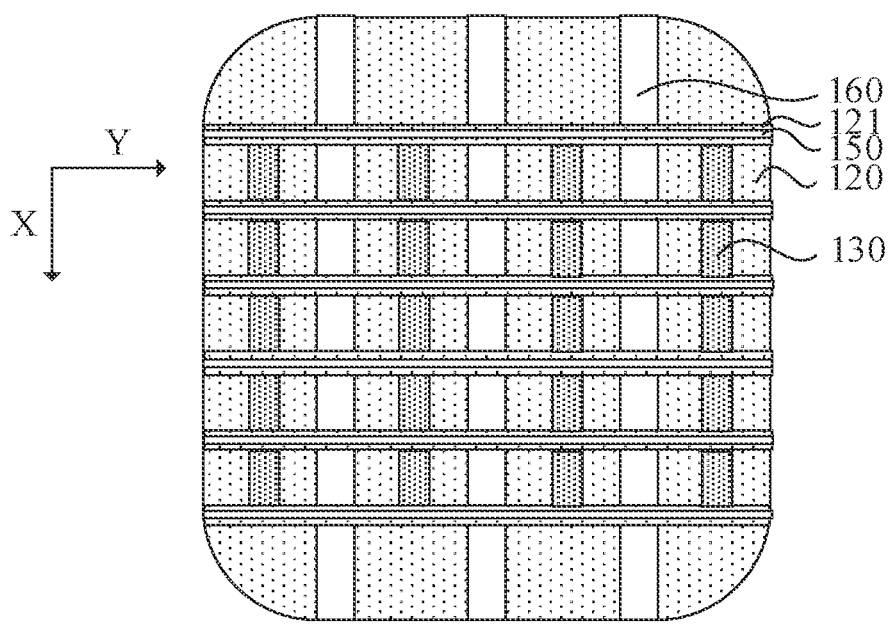
FIG. 3 is a top view of a first solar cell according to some embodiments of the present disclosure.
Figure 4:
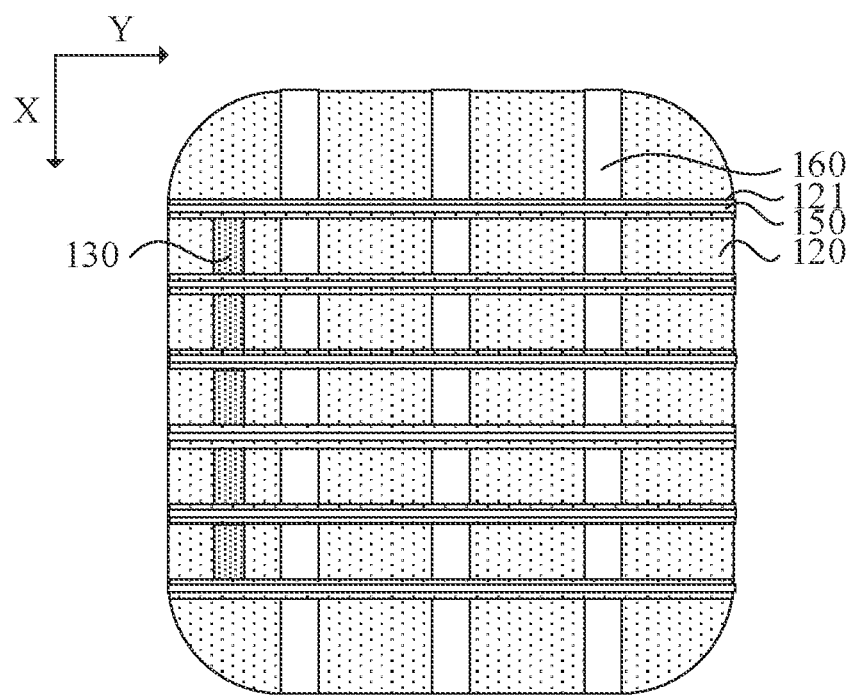
FIG. 4 is a top view of a second solar cell according to some embodiments of the present disclosure.
Figure 5:
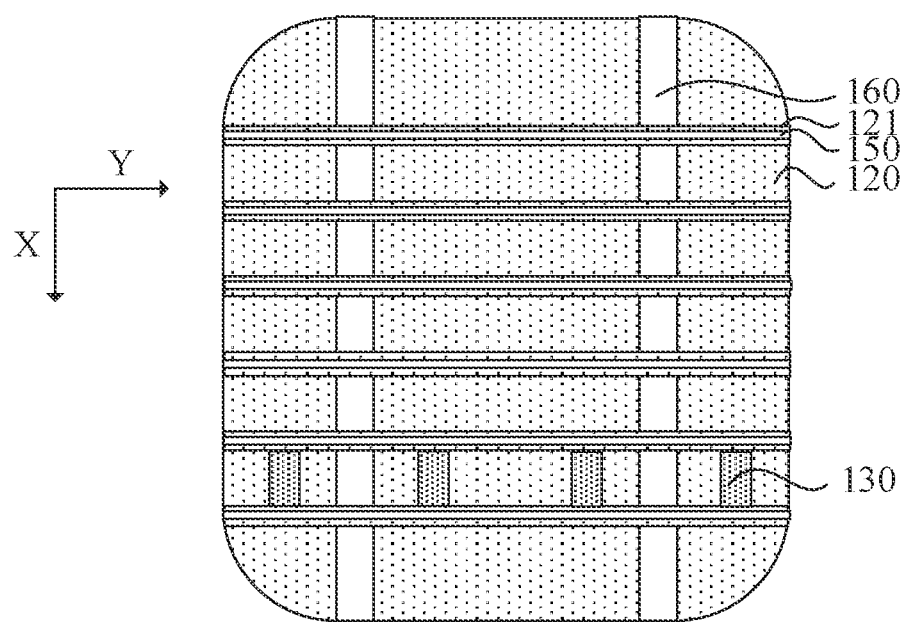
FIG. 5 is a top view of a third solar cell according to some embodiments of the present disclosure.
Figure 6:
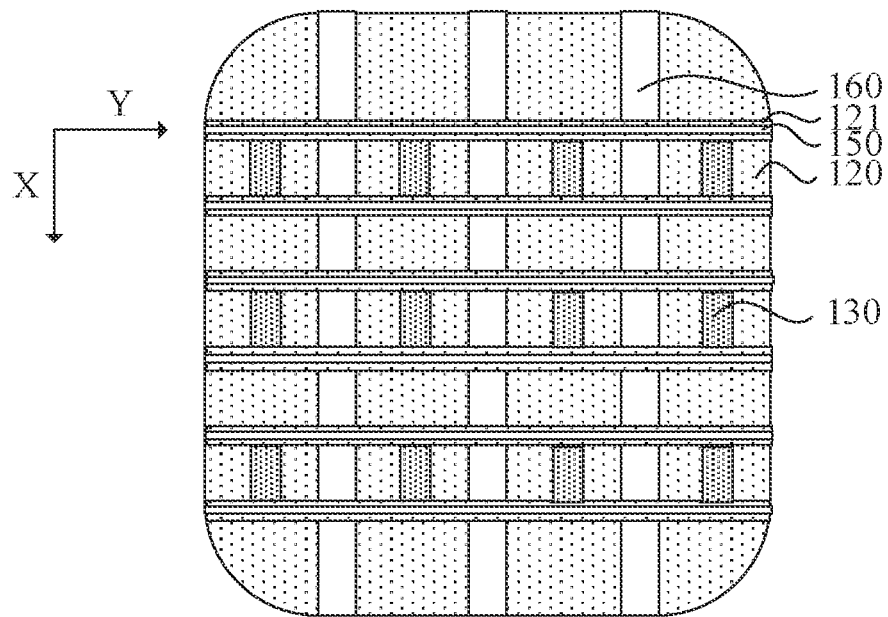
FIG. 6 is a top view of a fourth solar cell according to some embodiments of the present disclosure.
Figure 7:
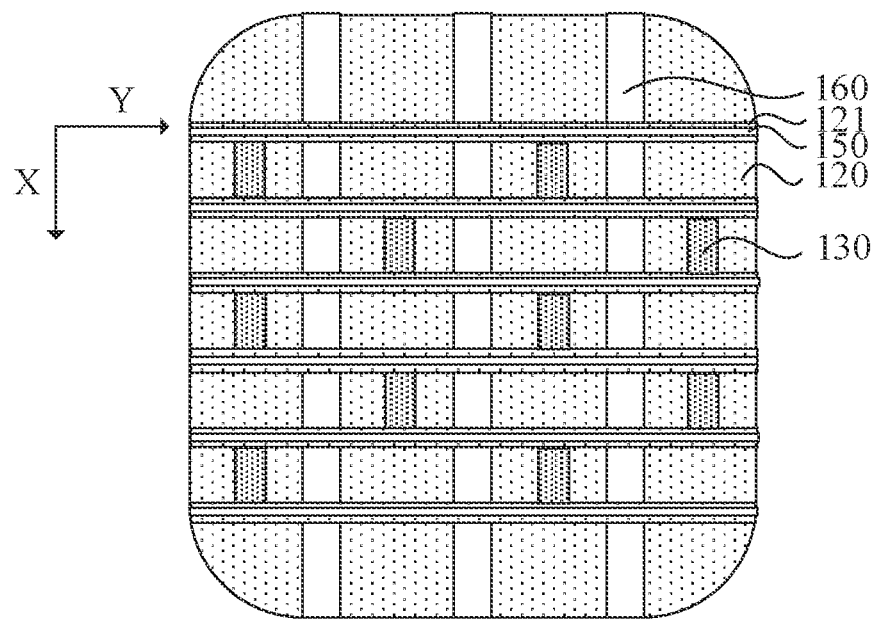
FIG. 7 is a top view of a fifth solar cell according to some embodiments of the present disclosure.

FIGS. 1 to 7 are structural schematic diagrams of the solar cell provided by embodiments of the present disclosure. FIG. 1 is a structural schematic diagram of a solar cell provided by some embodiments of the present disclosure. FIG. 2 is a sectional schematic diagram along the dotted line AA in FIG. 1 of the solar cell provided by some embodiments of the present disclosure. FIG. 3 is a top view of a first solar cell provided by some embodiments of the present disclosure. FIG. 4 is a top view of a second solar cell provided by some embodiments of the present disclosure. FIG. 5 is a top view of a third solar cell provided by some embodiments of the present disclosure. FIG. 6 is a top view of a fourth solar cell provided by some embodiments of the present disclosure. FIG. 7 is a top view of a fifth solar cell provided by some embodiments of the present disclosure.

Referring to FIGS. 1 to 7, the solar cell includes a substrate 100, a tunneling dielectric layer 110, a doped conductive layer 120, at least one conductive connection structure 130, a passivation layer 140 and a plurality of finger electrodes 150. The tunneling dielectric layer 110 is formed on the substrate 100. The doped conductive layer 120 is formed on the tunneling dielectric layer 110 and has a plurality of protrusions 121 arranged along a first direction X, each protrusion 121 of the plurality of protrusions 121 extends along a second direction Y perpendicular to the first direction X. The at least one conductive connection structure 130 is formed between two adjacent protrusions 121 and is connected with sidewalls of the two adjacent protrusions 121. The passivation layer 140 is over the doped conductive layer 120 and the at least one conductive connection structure 130. Each finger electrode 150 of the plurality of finger electrodes 150 extends along the second direction Y to penetrate the passivation layer 140 and connect to a respective protrusion 121. By forming the at least one conductive connection structure 130, carriers can be transversely transferred through the at least one conductive connection structure 130 between two adjacent protrusions 121. In this way, transverse transferring capacity of the solar cell can be improved.

In some embodiments, the substrate 100 is a silicon substrate, which may include one or more of monocrystalline silicon, polycrystalline silicon, amorphous silicon or microcrystalline silicon. In some other embodiments, the material of the substrate 100 may include silicon carbide, organic material or multicomponent compound. The multicomponent compound may include, but is not limited to, perovskite, gallium arsenide, cadmium telluride, copper indium selenium and the like.

In some embodiments, the substrate 100 has N-type or P-type doping elements. N-type elements may be Group-V elements such as phosphorus (P), bismuth (Bi), antimony (Sb) or arsenic (As), and P-type elements may be Group-III elements such as boron (B), aluminum (Al), gallium (Ga) or indium (In). For example, when the substrate 100 is a P-type substrate, the doping elements in the substrate are P-type elements. Alternatively, when the substrate 100 is an N-type substrate, the doping elements in the substrate are N-type elements.

In some embodiments, the tunneling dielectric layer 110 and the doped conductive layer 120 may form a passivation contact structure on the substrate 100. The formation of the tunneling dielectric layer 110 and the doped conductive layer 120 can reduce the recombination of carriers at surface of the solar cell and increase the open-circuit voltage of the solar cell, thereby improving the efficiency of the solar cell.

In some embodiments, the tunneling dielectric layer 110 may be formed on a first surface of the substrate 100. The first surface is a light receiving surface facing sunlight. In some embodiments, the tunneling dielectric layer 110 may be formed on a second surface of the substrate 100. The second surface is a surface opposite to the first surface and facing away sunlight. In some embodiments, the tunneling dielectric layer 110 may be formed on both the first surface and the second surface of the substrate 100 (not shown in FIG. 1). It should be understood that other layers on the tunneling dielectric layer 110 are also formed on the first surface and/or the second surface of the substrate 100 at the same time.

In some embodiments, the tunneling dielectric layer 110 may be further configured to reduce or prevent the diffusion of doping elements in the doped conductive layer 120 into the substrate 100.

In some embodiments, the materials of the tunneling dielectric layer 110 may include, but are not limited to, dielectric materials having tunneling effect such as aluminum oxide, silicon oxide, silicon nitride, silicon oxynitride, intrinsic amorphous silicon, intrinsic polycrystalline silicon and the like. The tunneling dielectric layer 110 may be formed by a layer of oxide of silicon (SiOx), which has good passivation characteristics, and carriers can easily tunnel through the layer of oxide of silicon.

In some embodiments, a thickness of the tunneling dielectric layer 110 may range from 0.5 nm to 2.5 nm. In some other embodiments, the thickness of the tunneling dielectric layer 110 ranges from 0.5 nm to 2 nm. In some other embodiments, the thickness of the tunneling dielectric layer 110 ranges from 0.5 nm to 1.2 nm. When the thickness of the tunneling dielectric layer 110 is less than 0.5 mm, it is difficult to form the tunneling dielectric layer 110. When the thickness of the tunneling dielectric layer 110 is greater than 2.5 mm, the tunneling effect is weak.

In some embodiments, the at least one conductive connection structure 130 and the doped conductive layer 120 are made of a same material. In this way, the variety of materials in the production process can be reduced to facilitate management. For example, the materials of the conductive connection structure 130 include at least one of polycrystalline silicon, amorphous silicon or microcrystalline silicon.

In some embodiments, the protrusions 121 of the doped conductive layer 120 and the at least one conductive connection structure 130 may be formed at the same time. In other words, the protrusions 121 and the at least one conductive connection structure 130 are formed by etching the doped conductive layer 120 in a same process operation. In this way, the connection reliability between the protrusions 121 and the at least one conductive connection structure 130 can be secured, and the number of production operations in the generating process and production time can be reduced. In some other embodiments, the protrusions and the at least one conductive connection structure may be formed separately.

In some embodiments, the material of the doped conductive layer 120 may be one of doped amorphous silicon, doped polycrystalline silicon or doped microcrystalline silicon. In some other embodiments, the doped conductive layer 120 may be made of other materials, such as silicon carbide, which may be selected according to actual situation.

In some embodiments, a conductive layer may be first formed on the tunneling dielectric layer 110, and then dope the conductive layer to form the doped conductive layer 120.

In some embodiments, the thickness of the doped conductive layer 120 ranges from 40 nm to 150 nm. In some other embodiments, the thickness of the doped conductive layer 120 ranges from 60 nm to 90 nm. The above-mentioned ranges of thickness of the doped conductive layer 120 can ensure that the optical loss of the doped conductive layer 120 is low and the interface passivation effect of the tunneling dielectric layer 110 is good, thereby improving the efficiency of the solar cell. In the embodiments of the present disclosure, the material of the doped conductive layer may be polycrystalline silicon.

In some embodiments, the doped conductive layer 120 and the substrate 100 are of a same doping type. It can be understood that when the doping type of the substrate 100 is N type and the doping type of the doped conductive layer 120 is P type, the majority carriers in the substrate 100 are electrons and the majority carriers in the doped conductive layer 120 are holes, recombination will occur between the electrons and the holes, resulting in reduction of the carriers collected by the finger electrodes 150. Therefore, when the doped conductive layer 120 and the substrate 100 are of a same doping type, reduction of the carriers collected by the finger electrodes 150 can be prevented.

In some embodiments, the substrate 100 is an N-type substrate, and the doped conductive layer 120 is an N-type polycrystalline silicon layer. In some other embodiments, the substrate is a P-type substrate, and the doped conductive layer is a P-type polycrystalline silicon layer. The N-type substrate and N-type polycrystalline silicon layer have relatively high photoelectric conversion efficiency. The formation process of the P-type substrate and P-type polycrystalline silicon layer is simple and can be selected according to the actual situation. The embodiments of the present disclosure do not limit the substrate 100 and the doped conductive layer 120.

In some embodiments, the conductive connection structure 130 and the protrusions 121 are formed by etching the doped conductive layer 120. The shape of the doped conductive layer 120 may be set first, and then the doped conductive layer 120 is etched to form the protrusions 121 and the conductive connection structure 130 in a same process operation.

In some embodiments, the passivation layer 140 may be an antireflection film layer. In this way, the light reflected by the surface of the solar cell can be reduced, thereby increasing the light transmittance of the solar cell. The passivation layer 140 may have a single-layer structure or a stacked-layers structure, and the materials of the passivation layer 140 may include one or more of silicon oxide, silicon nitride, silicon oxynitride, silicon oxycarbonitride, titanium oxide, hafnium oxide, aluminum oxide or the like. In some embodiments, the passivation layer 140 is a hydrogen containing passivation layer, for example, the passivation layer is made of silicon oxide containing hydrogen, silicon nitride containing hydrogen, silicon oxynitride containing hydrogen and the like.

In some embodiments, the plurality of finger electrodes 150 is used to collect and converge the currents of the solar cell. The finger electrodes 150 may be obtained by sintering firing-through paste. The materials of the finger electrodes 150 may include one or more of aluminum, silver, gold, nickel, molybdenum or copper. In some embodiments, the finger electrodes 150 refer to thin grid lines or finger grid lines, which are different from the main grid lines or busbars.

Referring to FIGS. 3 to 7, in some embodiments, the solar cell includes a plurality of conductive connection structures 130 arranged at intervals along at least one of the first direction X and the second direction Y, and there is at least one finger electrode 150 between adjacent conductive connection structures 130 in the first direction X. In other words, the plurality of conductive connection structures 130 may be arranged at intervals along the first direction X, the second direction Y or the first direction X and the second direction Y. In the first direction X, there is at least one finger electrode 150 between adjacent conductive connection structures 130. When there is one finger electrode 150 between adjacent conductive connection structures 130, there is one or more conductive connection structures 130 between every two adjacent protrusions. When there are a plurality of finger electrodes 150 between adjacent conductive connection structures 130, the conductive connection structures 130 may be distributed in a spaced manner. For example, in the first direction, there is one or more conductive connection structures 130 between a first and a second finger electrodes, but there is no conductive connection structure 130 between the second and a third finger electrodes. By forming at least one finger electrode 150 between adjacent conductive connection structures 130, the transverse transferring capacity of the solar cell can be improved.

It is noted that the above-mentioned first finger electrode, second finger electrode and third finger electrode are only used to illustrate, and do not constitute a limit to the finger electrodes 150.

Referring to FIGS. 3 and 4, in some embodiments, there is at least one conductive connection structure 130 between each two adjacent finger electrodes 150. In other words, there is at least one conductive connection structure 130 between all finger electrodes 150 that are adjacent. In this way, the transverse transferring capacity between adjacent protrusions 121 can be improved.

Referring to FIG. 6, in some embodiments, there is at least one conductive connection structure 130 between some of the adjacent finger electrodes 150, there is no conductive connection structure 130 between some of the adjacent finger electrodes 150, and in the first direction, the conductive connection structures 130 may be arranged in a regular manner. For example, there is one or more conductive connection structures 130 between a first and a second finger electrodes, there is no conductive connection structure 130 between the second and a third finger electrodes, and there is one or more conductive connection structures 130 between the third and a fourth finger electrodes, and so on. Alternatively, there is one or more conductive connection structures 130 between the first and the second finger electrodes, there is one or more conductive connection structures 130 between the second and the third finger electrodes, there is no conductive connection structure 130 between the third and the fourth finger electrodes, and there is one or more conductive connection structures 130 between the fourth and a fifth finger electrodes, and so on. Alternatively, the conductive connection structures 130 may be arranged in an irregular manner.

It is noted that the above-mentioned arrangement manners are only examples for ease of illustration, other arrangement manners also can be applied.

Referring to FIG. 3, in some embodiments, there are a plurality of conductive connection structures 130 arranged at intervals between adjacent finger electrodes 150. That is to say, there are a plurality of conductive connection structures 130 arranged at intervals along the second direction between adjacent finger electrodes 150. In this way, the transverse transferring capacity between adjacent finger electrodes 150 can be improved. Compared with the case where there is only one conductive connection structure 130 between adjacent finger electrodes 150, the more the conductive connection structures 130, the stronger the transverse transferring capacity is.

In some embodiments, in the second direction Y, a distance between adjacent conductive connection structures 130 of the plurality of conductive connection structures 130 arranged at intervals is constant. In this way, it is convenient to the laser ablation process in the generating process, in other word, there is no need of adjusting the distance between adjacent conductive connection structures, thereby being convenient to the production.

In some embodiments, a distance between adjacent conductive connection structures 130 in the second direction ranges from 0.01 mm to 20 mm, such as 0.1 mm, 0.5 mm, 10 mm or the like. When the distance between adjacent conductive connection structures 130 is less than 0.01 mm, excessively serried conductive connection structures 130 may cause serious light absorption, which is not conducive to improving the photoelectric conversion efficiency of the solar cell. When the distance between adjacent conductive connection structures 130 is greater than 20 mm, excessively few conductive connection structures 130 cannot provide improving effect good enough. In some other embodiments, the distance between adjacent conductive connection structures 130 may have other values, which may be determined according to actual situation, embodiments of the present disclosure do not limit the distance between adjacent conductive connection structures 130.

Referring to FIGS. 3, 6 and 7, in some embodiments, the plurality of conductive connection structures 130 form an array, and the array includes a plurality of columns of conductive connection structures 130 arranged along the first direction X and a plurality of rows of conductive connection structures 130 arranged along the second direction Y. In other words, the plurality of conductive connection structures 130 are arranged in a regular manner along the first direction X and the second direction Y. In this way, the transverse transferring capacity of the solar cell can be improved, and the production difficulty of forming the plurality of conductive connection structures 130 can be reduced.

Taking the solar cell including 4 columns of conductive connection structures 130 arranged along the first direction X as an example, a first, a second, a third and a fourth columns of conductive connection structures are arranged along the first direction X in sequence, and in the second direction Y, any conductive connection structure of the first column of conductive connection structures and a respective conductive connection structure of the second column of conductive connection structures, a respective conductive connection structure of the third column of conductive connection structures and a respective conductive connection structure of the fourth column of conductive connection structures are in a same row. In some other embodiments, any conductive connection structure of the first column of conductive connection structures and a respective conductive connection structure of the second column of conductive connection structures may be not in a same row. In other words, in the second direction, the first and second column of conductive connection structures are arranged in a stagger manner relative to each other. Alternatively, some conductive connection structures of the first column of conductive connection structures and respective conductive connection structures of the second column of conductive connection structures are respectively arranged in a same row. The present disclosure does not specifically limit the conductive connection structures 130, as long as the plurality of conductive connection structures 130 form an array.

In some embodiments, a width of the at least one conductive connection structure 130 in the second direction Y ranges from 10 μm to 500 μm, such as 50 μm, 80 μm, 100 μm or the like. It should be understood that when the width of the at least one conductive connection structure 130 is less than 10 μm, the transverse transferring capacity of each conductive connection structure 130 is weak, and the conductive connection structure cannot provide good improving effect. When the width of the at least one conductive connection structure 130 is greater than 500 μm, the conductive connection structure 130 may have a high-level parasitic absorption of light, which is detrimental to the improvement of photoelectric conversion efficiency of the solar cell. In some other embodiments, the width of the at least one conductive connection structure 130 may have other values, which may be determined according to actual situation.

In some embodiments, a top surface of the at least one conductive connection structure 130 is lower than or flush with a top surface of a protrusion 121. In other words, in a direction perpendicular to the surface of the substrate 100, a thickness of the at least one conductive connection structure 130 is less than or equal to a thickness of a protrusion 121. When the top surface of the conductive connection structure 130 is lower than the top surface of the protrusion 121, light-absorption capacity of the conductive connection structure 130 can be reduced, which is conducive to improving photoelectric conversion efficiency of the solar cell. When the top surface of the conductive connection structure 130 is flush with the top surface of the protrusion 121, the production process of the solar cell can be simplified, and the protrusions 121 and the at least one conductive connection structure 130 can be formed in a same process operation by laser ablation. In some other embodiments, the top surface of the conductive connection structure 130 may be higher than the top surface of the protrusion 121, which may be determined according to actual situation.

In some embodiments, in the direction perpendicular to the surface of the substrate 100, a height of the at least one conductive connection structure 130 may be 0.5 to 1.2 times of a height of a protrusion 121. When the height of the conductive connection structure 130 is less than 0.5 times of the height of the protrusion 121, the conductive connection structure 130 is relatively thin, which results in a relatively weak transverse transferring capacity and a not prominent improvement. When the height of the conductive connection structure 130 is greater than 1.2 times of the height of the protrusion 121, the conductive connection structure 130 is relatively thick, which results in a relatively strong capacity of parasitic absorption of light of the conductive connection structure 130 and therefore a reduction in the photoelectric conversion efficiency of the solar cell.

In some embodiments, the solar cell further includes at least one busbar 160 extending along the first direction X and electrically connected with the plurality of finger electrodes 150 arranged along the first direction X. Through the at least one busbar 160, the currents collected by the plurality of finger electrodes 150 can be converged and outputted from the solar cell.

In some embodiments, the plurality of conductive connection structures 130 are spaced from the at least one busbar 160. In this way, the at least one busbar 160 can be limited by the plurality of conductive connection structures 130, which is conducive to the subsequent printing of the at least one busbar 160. Moreover, the position of the at least one busbar 160 can be determined without additional positioning operation, which is conducive to the production operations.

In some embodiments, a column of conductive connection structures 130 arranged at intervals along the first direction X may be formed between adjacent busbars 160. In some other embodiments, more than one column of conductive connection structures 130 arranged at intervals along the first direction X may be formed between adjacent busbars 160. The present disclosure does not limit the number of the conductive connection structures 130 between adjacent busbars 160, which may be determined according to actual situation.

In some embodiments, projections of the plurality of conductive connection structures 130 on the substrate 100 are at least partially overlapped with a projection of the at least one busbar 160 on the substrate 100. The busbar 160 is generally of non-sintered type and used to collect the photo-generated carriers collected by the plurality of finger electrodes 150. That is to say, the busbar 160 will not corrode the structure under the busbar 160, so that the conductive connection structures 130 formed under the busbar 160 will not be affected by the busbar. Therefore, the transverse transferring capacity of the conductive connection structures 130 will not be affected. Moreover, the busbar 160 that at least shields a part of each conductive connection structures 130 can reduce capacity of parasitic absorption of light of the conductive connection structures 130, thereby improving the photoelectric conversion efficiency of the solar cell.

In some embodiments, the solar cell includes a plurality of busbars, and there are at least two columns of conductive connection structures 130 arranged along the first direction X on a side of a peripheral busbar 160 towards an edge of the substrate. In some other embodiments, no conductive connection structure or one column of conductive connection structures arranged along the first direction is formed on the side of the peripheral busbar towards the edge of the substrate. By forming at least two columns of conductive connection structures 130, the number of the conductive connection structures 130 can be increased, thereby improving the transverse transferring capacity of the solar cell.

In some embodiments, the solar cell has a front surface and a rear surface. The front surface is a light receiving surface that absorbs incident light, and the rear surface is a surface opposite to the front surface. The tunneling dielectric layer 110, the doped conductive layer 120, the at least one conductive connection structure 130, the passivation layer 140 and the plurality of finger electrodes 150 may be respectively formed over the front surface and the rear surface of the solar cell.

In some embodiments, a doped conductive layer 120 formed over the rear surface of the solar cell and the substrate 100 are of a same doping type, and a doped conductive layer 120 formed over the front surface of the solar cell and the substrate 100 are of different doping types. Taking the substrate 100 being an N-type substrate as an example, doping type of the doped conductive layer 120 formed over the rear surface of the solar cell is N type, and doping type of the doped conductive layer 120 formed over the front surface of the solar cell is P type.

In the embodiments of the present disclosure, the tunneling dielectric layer 110 and the doped conductive layer 120 are formed over the substrate 100, and the doped conductive layer 120 has a plurality of protrusions 121, thereby forming height differences on the doped conductive layer 120. In this way, contacts between the plurality of finger electrodes 150 and the doped conductive layer 120 can be ensured, and the parasitic absorption of light of the doped conductive layer 120 can be reduced. At least one conductive connection structure 130 is formed between adjacent protrusions 121 of the doped conductive layer 120, and the adjacent protrusions 121 are connected by the conductive connection structure 130. In this way, the transverse transferring capacity of the doped conductive layer 120 can be improved, thereby increasing the transfer rate of the solar cell.

Figure 8:
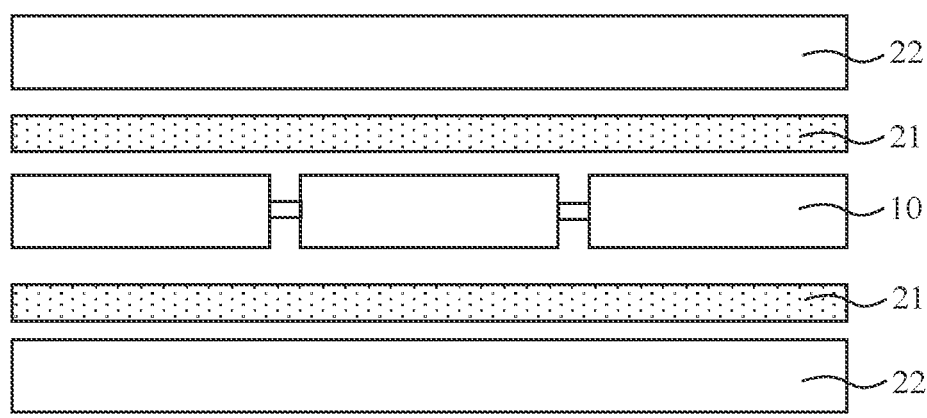
FIG. 8 is a structural schematic diagram of a photovoltaic module according to some embodiments of the present disclosure.

Referring to FIG. 8, embodiments of the present disclosure provide a photovoltaic module configured to convert the received light energy into electrical energy and transfer it to external loads. The photovoltaic module includes at least one cell string 10, at least one encapsulation layer 21 and at least one cover plate 22. The at least one cell string 10 includes a plurality of solar cells as described above (such as, FIGS. 1 to 4), and the plurality of solar cells are electrically connected in sequence. The at least one encapsulation layer is configured to cover a surface of the at least one cell string. The at least one cover plate is configured to cover a surface of the at least one encapsulation layer 21 facing away from the at least one cell string.

The at least one encapsulation layer 21 may be an organic encapsulation adhesive film such as an ethylene vinyl acetate copolymer (EVA) adhesive film, or a polyethylene octene copolymer (POE) adhesive film. The encapsulation layer 21 covers a surface of the cell string to seal and protect the cell string. In some embodiments, the encapsulation layers 21 includes an upper encapsulation adhesive film and a lower encapsulation adhesive film that respectively cover an upper surface and a lower surface of the cell string. The at least one cover plate 22 may be a cover plate for protecting the cell string, such as a glass cover plate, a plastic cover plate or the like. The at least one cover plate 22 covers a surface of the encapsulation layer 21 facing away from the cell string. In some embodiments, the cover plate 22 has a light trapping structure to increase the utilization rate of the incident light. In this way, the photovoltaic module can have high current-collection capacity, low carrier recombination rate, and therefore high photoelectric conversion efficiency. In some embodiments, the cover plates 22 include an upper cover plate and a lower cover plate located on either sides of the cell string.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure. Therefore, the patent scope of protection of the present disclosure shall still be subject to the scope limited by the appended claims.

What is claimed is:

1. A solar cell, comprising:
   a substrate;
   a tunneling dielectric layer formed on the substrate;
   a doped conductive layer formed on the tunneling dielectric layer, wherein the doped conductive layer has a plurality of protrusions arranged along a first direction, and each protrusion of the plurality of protrusions extends along a second direction perpendicular to the first direction;
   a plurality of conductive connection structures formed at intervals along the second direction, wherein each conductive connection structure of the plurality of conductive connection structures is formed between two respective adjacent protrusions, and each conductive connection structure extends along the first direction and is directly connected with sidewalls of the two respective adjacent protrusions, and wherein in a third direction away from the substrate and perpendicular to the first direction and the second direction, a top surface of any of the plurality of conductive connection structures is lower than or flush with a top surface of a respective protrusion of the plurality of protrusions;
   a passivation layer over the doped conductive layer and the plurality of conductive connection structures; and
   a plurality of finger electrodes, wherein each finger electrode of the plurality of finger electrodes extends along the second direction and penetrates the passivation layer to connect to a respective protrusion of the plurality of protrusions.

2. The solar cell according to claim 1, wherein the plurality of conductive connection structures are arranged at equal intervals along the second direction.

3. The solar cell according to 1, wherein a distance between adjacent conductive connection structures of the plurality of conductive connection structures in the second direction ranges from 0.01 mm to 20 mm.

4. The solar cell according to claim 1, wherein the plurality of conductive connection structures form an array, and the array includes a plurality of columns of conductive connection structures arranged along the first direction and a plurality of rows of conductive connection structures arranged along the second direction.

5. The solar cell according to claim 4, further comprising at least one busbar extending along the first direction and electrically connected with the plurality of finger electrodes arranged along the first direction.

6. The solar cell according to claim 4, wherein conductive connection structures of every two adjacent columns of the plurality of columns of conductive connection structures are arranged in a staggered manner in the second direction.

7. The solar cell according to claim 5, wherein each column of the plurality of columns of conductive connection structures is spaced from the at least one busbar.

8. The solar cell according to claim 5, wherein projections of the plurality of conductive connection structures on the substrate are at least partially overlapped with a projection of the at least one busbar on the substrate.

9. The solar cell according to claim 5, comprising a plurality of busbars, wherein there are at least two columns of conductive connection structures arranged along the first direction on a side of a peripheral busbar towards an edge of the substrate.

10. The solar cell according to claim 1, wherein a width of one respective conductive connection structure of the plurality of conductive connection structures in the second direction ranges from 10 μm to 500 μm.

11. The solar cell according to claim 1, wherein the plurality of conductive connection structures and the doped conductive layer are made of a same material.

12. The solar cell according to claim 11, wherein a material of the doped conductive layer includes one of doped amorphous silicon, doped polycrystalline silicon and doped microcrystalline silicon.

13. The solar cell according to claim 11, wherein the doped conductive layer and the substrate are of a same doping type.

14. The solar cell according to claim 11, wherein the substrate is an N-type substrate, and the doped conductive layer is an N-type polycrystalline silicon layer.

15. A photovoltaic module, comprising:
at least one cell string including a plurality of solar cells, wherein the plurality of solar cells are electrically connected in sequence;
at least one encapsulation layer configured to cover a surface of the at least one cell string; and
at least one cover plate configured to cover a surface of the at least one encapsulation layer facing away from the at least one cell string;
wherein each of the plurality of solar cells includes:
a substrate;
a tunneling dielectric layer formed on the substrate;
a doped conductive layer formed on the tunneling dielectric layer, wherein the doped conductive layer has a plurality of protrusions arranged along a first direction, and each protrusion of the plurality of protrusions extends along a second direction perpendicular to the first direction;
a plurality of conductive connection structures formed at intervals along the second direction, wherein each conductive connection structure of the plurality of conductive connection structures is formed between two respective adjacent protrusions, and each conductive connection structure extends along the first direction and is directly connected with sidewalls of the two respective adjacent protrusions, and wherein in a third direction away from the substrate and perpendicular to the first direction and the second direction, a top surface of any of the plurality of conductive connection structures is lower than or flush with a top surface of a respective protrusion of the plurality of protrusions;
a passivation layer over the doped conductive layer and the plurality of conductive connection structures; and
a plurality of finger electrodes, wherein each finger electrode of the plurality of finger electrodes extends along the second direction and penetrates the passivation layer to connect to a respective protrusion of the plurality of protrusions.

16. The photovoltaic module according to claim 15, further comprising at least one busbar extending along the first direction and electrically connected with the plurality of finger electrodes arranged along the first direction.

* * * * *